United States Patent
Ko

(10) Patent No.: US 7,745,992 B2
(45) Date of Patent: Jun. 29, 2010

(54) ORGANIC ELECTROLUMINESCENCE DEVICE HAVING ELECTRODE SEPARATOR AND LIGHT SHIELDING PATTERN

(75) Inventor: Doo Hyun Ko, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 11/019,611

(22) Filed: Dec. 23, 2004

(65) Prior Publication Data

US 2005/0140287 A1   Jun. 30, 2005

(30) Foreign Application Priority Data

Dec. 29, 2003   (KR) .................. 10-2003-0099389

(51) Int. Cl.
  *H01J 1/62*   (2006.01)
  *H01J 63/04*   (2006.01)
(52) U.S. Cl. .................. 313/506; 313/504; 313/507; 313/509
(58) Field of Classification Search ................ 313/504, 313/505, 506, 507, 509
  See application file for complete search history.

(56) References Cited

U.S. PATENT DOCUMENTS 7,012,366 B2   3/2006   Park et al.

2003/0178936 A1 *   9/2003   Park et al. .................. 313/505
2003/0205763 A1 *   11/2003  Park et al. .................. 257/359
2004/0041753 A1 *   3/2004   Nakanishi .................... 345/76

FOREIGN PATENT DOCUMENTS

CN   1446032   10/2003

* cited by examiner

*Primary Examiner*—Bumsuk Won
(74) *Attorney, Agent, or Firm*—Morgan Lewis & Bockius LLP

(57) ABSTRACT

An organic electroluminescence (EL) device includes an array element divided into sub-pixels on a first substrate and including thin film transistors in the sub-pixels, a first electrode disposed on a second substrate, an electrode separator disposed below the first electrode at a boundary region between the sub-pixels, an organic EL layer disposed below the first electrode, a second electrode patterned in each of the sub-pixels by the organic EL layer and the electrode separator, a conductive spacer electrically connecting the thin film transistors with the second electrode, an interlayer disposed at selected regions below the first electrode, and a light shielding portion disposed on the second substrate and overlapping the interlayer.

12 Claims, 6 Drawing Sheets

ORGANIC ELECTROLUMINESCENCE DEVICE HAVING ELECTRODE SEPARATOR AND LIGHT SHIELDING PATTERN

The present invention claims the benefit of the Korean Application No. 99389/2003 filed on in Korea Dec. 29, 2003, which is hereby incorporated by reference.

BACKGROUND OF THE INVENTION

1. Field of the Invention

The present invention relates to a light emitting device, and more particularly, to an organic electroluminescence (EL) device.

2. Discussion of the Related Art

Among flat panel displays, an organic electroluminescence (EL) device is a self-emission type display with higher contrast and wider viewing angle as compared to a liquid crystal display (LCD). The organic EL device can be made lightweight and slim profile as compared to other display types because it does not require a backlight. The organic EL device also uses less power than other types of flat panel displays. Further, the organic EL device can be driven with a low DC voltage and still have a rapid response rate. Since all of the components of the organic EL device are formed of solid materials, it can withstand an impact. The organic EL device can operate throughout a wide temperature range and be manufactured at a low cost. Unlike fabricating an LCD or a PDP, the organic EL device is manufactured just using a deposition process and an encapsulation process. Thus, the manufacturing processes and apparatuses for making an organic EL device are very simple.

A passive matrix type organic EL device without a switching element has been widely used. In the passive matrix type, gate lines (scan lines) cross data lines (signal lines) to define a matrix of sub-pixels. The gate lines are sequentially driven to drive each sub-pixel. To exhibit a required mean luminescence, a higher level of moment luminance must be emitted sequentially in each sub-pixel across the display to create an overall average luminance.

In an active matrix type, thin film transistors acting as switching elements are located in respective sub-pixels. The voltage applied to the sub-pixels are charged in a storage capacitor Cst so that the voltage can be applied until a next frame signal is applied, thereby continuously driving the organic EL device, regardless of the number of gate lines, to display a picture. Accordingly, in the active matrix type, even when low current is applied, uniform luminescence can be obtained. As a result, the organic EL device has the advantages of low power consumption, high definition and large-sized screen capability. Such an active matrix type organic EL device will now be described with reference to the accompanying drawings.

FIG. 1 is a cross-sectional view schematically showing a bottom emission organic EL device according to the related art, wherein a unit pixel region includes red (R), green (G) and blue (B) sub-pixels. As shown in FIG. 1, the related art bottom emission organic EL device includes a first substrate 10 and a second substrate 30 facing each other and sealed by a seal pattern 40. The first substrate 10 includes a transparent substrate 1, thin film transistors T formed in each sub-pixel on the transparent substrate 1, first electrodes 12 connected with the thin film transistors T, an organic EL layer 14 connected with the thin film transistors T and disposed corresponding to the first electrodes 12 on the thin film transistors T, and a second electrode 16 formed on the organic EL layer 14. The organic EL layer 14 includes emission materials emitting red (R), green (G) and blue colors. The first and second electrodes 12 and 16 apply an electric field to the organic EL layer 14.

The second electrode 16 is spaced away from the second substrate 30 by the seal pattern 40. A moisture absorbent (not shown) for preventing moisture from leaking to an outside is filled into an inner surface of the second substrate 30 and fixed by a semi-transparent tape (not shown). In the related art bottom emission structure, the first electrode 12 serves as an anode and is selected from a group consisting of transparent conductive materials, whereas the second electrode 16 serves as a cathode and is selected from a group consisting of metal materials having a low work function. Thus, the organic EL layer 14 has a stack structure where a hole injection layer 14a, a hole transporting layer 14b, an emission layer 14c, an electron transporting layer 14d that are sequentially stacked starting from the hole injection layer 14a contacting the first electrode 12. Herein, the emission layer 14c has a structure in which the emission materials emitting red (R), green (G) and blue colors are sequentially arranged corresponding to the respective sub-pixels.

The related art organic EL device has a limitation in fine-patterning the red (R), green (G) and blue pixels with high reproduction under a large area. For example, since the organic EL material for the organic EL layer 14 is vulnerable to solvent or moisture, it cannot be patterned by a wet etch. For this reason, the organic EL material cannot be patterned by photolithography, which is advantageous in forming fine patterns.

Low molecular organic EL material can be patterned by a method including installing a fine-patterned shadow mask on a substrate and then independently forming R, G, B materials. However, this method is limited in precisely fabricating the shadow mask to have fine patterns over a resolution of a predetermined level and employing the shadow mask in a high definition and large area due to the tension deviation of the shadow mask and the like. Also, another pixel patterning method using a high molecular organic EL material inkjet injection head has been researched, but it is difficult for forming a pinhole-free thin film less than 1000 Å.

The related art bottom emission structure organic EL devices are fabricated by attaching the first substrate 10 provided with an array device and an organic EL diode to the second substrate 30 for separate encapsulation. Thus, a yield of the organic EL display is determined by both of a yield of the array device and a yield of the organic EL diode, and therefore, an overall process yield is greatly limited to a latter process, namely, the process of forming the organic EL diode. For example, even though the array device is formed excellently, if defects occur due to foreign matters or other factors in forming the organic EL layer employing a thin film of about 1000 Å thick, the entire organic EL device is rendered defective. Consequently, a defective organic EL layer results in decreased production yield and increased material costs in manufacturing the non-defective array element associated with the defective organic EL layer.

In addition, since the bottom emission structure has high stability and high process freedom because of the encapsulation, but has a limitation in the aperture ratio, it is suitable to employ the bottom emission structure for high resolution products.

SUMMARY OF THE INVENTION

Accordingly, the present invention is directed to an organic EL device that substantially obviates one or more problems due to limitations and disadvantages of the related art.

An object of the present invention is to provide an organic EL device that can improve the picture quality by forming an opaque light shielding pattern on a region where poor picture quality occurs.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided an organic EL device, including: includes an array element divided into sub-pixels on a first substrate and including thin film transistors disposed in the sub-pixels, a first electrode disposed on a second substrate, an electrode separator disposed below the first electrode at a boundary region between the sub-pixels, an organic EL layer disposed below the first electrode, a second electrode patterned in each of the sub-pixels by the organic EL layer and the electrode separator, a conductive spacer electrically connecting the thin film transistors provided on the first substrate with the second electrode provided on the second substrate, an interlayer disposed at selected regions below the first electrode, and a light shielding portion disposed on the second substrate and overlapping the interlayer.

In another aspect, the organic EL device includes an array element divided into sub-pixels on a first substrate and including thin film transistors disposed in the sub-pixels, a first electrode disposed on a second substrate, an electrode separator disposed below the first electrode at a boundary region between the sub-pixels, an organic EL layer disposed below the first electrode, a second electrode patterned in each of the sub-pixels by the organic EL layer and the electrode separator, a conductive spacer electrically connecting the thin film transistors provided on the first substrate with the second electrode provided on the second substrate, an interlayer disposed at selected regions below the first electrode, and a light shielding portion disposed on the second substrate and overlapping the electrode separator.

In another aspect, the organic EL device includes a first substrate and a second substrate facing each other and spaced apart by a predetermined interval, an array element divided into sub-pixels on the first substrate and including thin film transistors disposed in the sub-pixel, an EL diode disposed on the second substrate, and including a first electrode, an organic EL layer and a second electrode that are sequentially laminated, an electrode separator disposed below the first electrode at a boundary region between the sub-pixels, and a conductive spacer electrically connecting the array element provided on the first substrate with the EL diode provided on the second substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
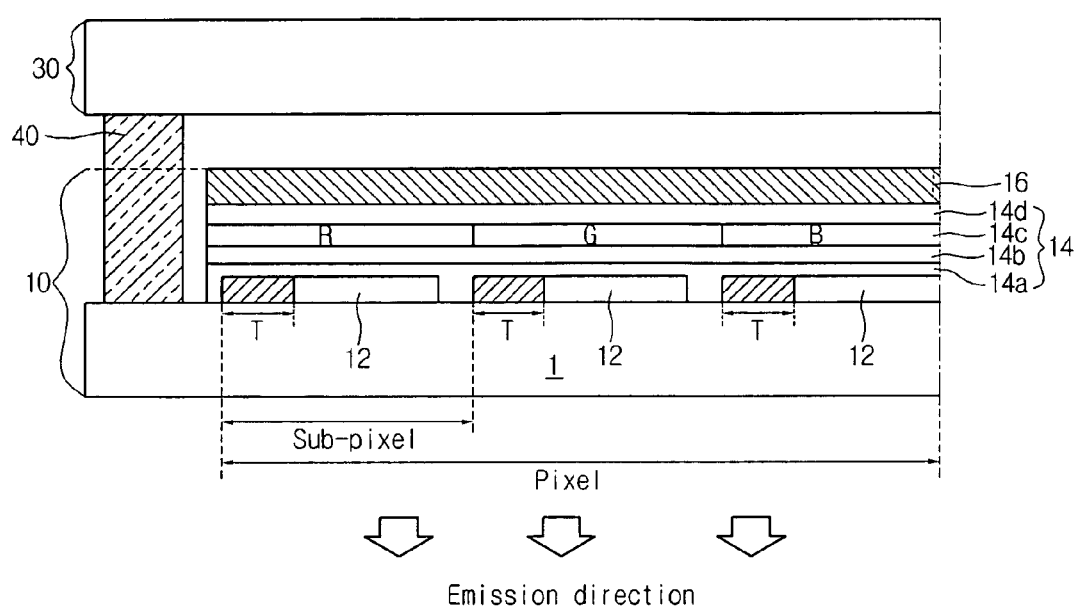
FIG. 1 is a cross-sectional view schematically showing a bottom emission organic EL device according to the related art.
Figure 2:
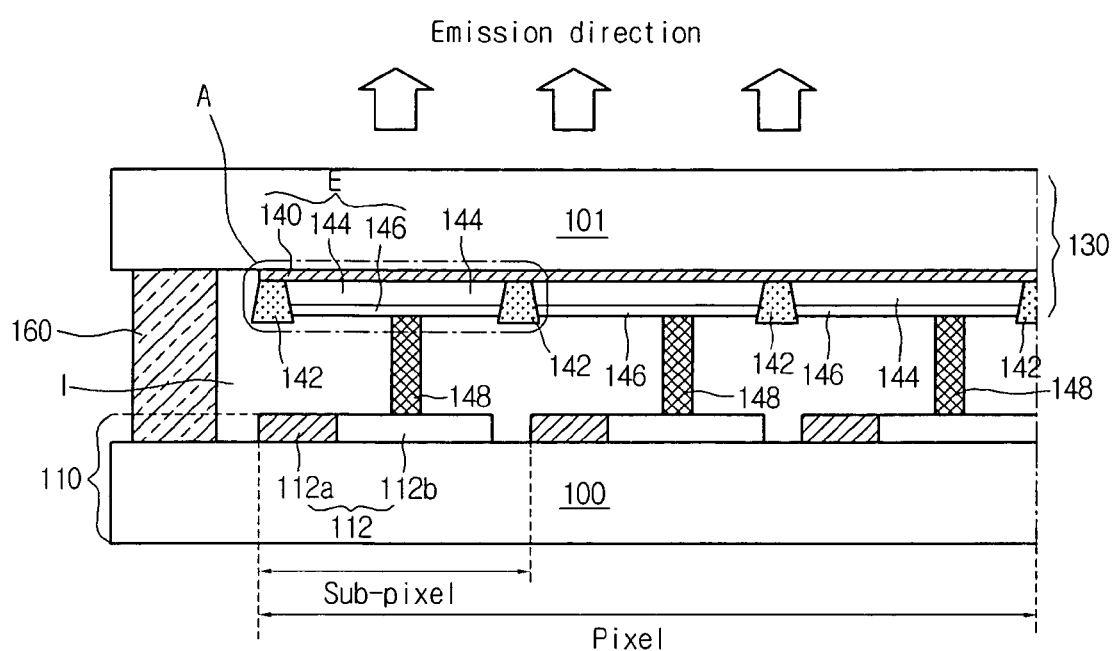
FIG. 2 is a cross-sectional view schematically showing a dual panel type organic EL device according to an exemplary embodiment of the present invention.

FIG. 2 is a cross-sectional view schematically showing a dual panel type organic EL device according to an exemplary embodiment of the present invention. The dual panel type organic EL device is capable of overcoming the drawbacks of the related art bottom emission type organic EL device. As shown in FIG. 2, the dual panel type organic EL device includes a first substrate 110 and a second substrate 130 disposed facing each other and attached by a seal pattern 160.

The first substrate 110 includes a transparent substrate 100 and an array element 112 formed on the transparent substrate 100. The second substrate 130 includes a transparent substrate 101 and an organic EL diode E formed on an inner surface of the transparent substrate 101. The organic EL diode E includes a first electrode 140 serving as a common electrode, electrode separators 142 disposed at boundaries of the sub-pixels below the first electrode 140, an organic EL layer 144, and a second electrode 146. The organic EL layer 144 and the second electrode 146 are sequentially disposed between the adjacent electrode separators 142 and corresponding to each sub-pixel. Since the electrode separator 142 serves to pattern the second electrode 146 in each sub-pixel, the electrode separator 142 preferably has a trapezoidal structure in which width is reduced from the second electrode 146 to the first electrode 140.

The seal pattern 160 is formed along an edge between the first and second substrates 110 and 130 to attach them and to maintain a constant cell gap. The array element 112 on the first substrate 110 includes a thin film transistor 112a as a switching element, and an electrical connector 112b connected with the thin film transistor 112a. Conductive spacers 148 for electrically connecting the electrical connectors 112b of the first substrate 110 with the second electrode 146 of the second substrate 130 are formed in each sub-pixel. The thin film transistor 112a corresponds to a drive transistor connected with the organic EL diode E. The electrical connector 112b may correspond to any of source and drain electrodes (not shown) of the thin film transistor 112a, or may be made of a separate conductive material connected with the source and drain electrodes.

The organic EL layer 144 has a multi-layered structure depending on the arrangement of anode and cathode. In one example, when the first electrode 140 and the second electrode 146 are designed to be cathode and anode, respectively, the organic EL layer 144 has the multi-layered structure such that a hole injection layer contacting the first electrode 140, a hole transporting layer, an emission layer, an electron transporting layer, an electron injection layer are sequentially arranged. Moreover, the conductive spacers 148 connecting the second electrode 146 with the thin film transistor 112*a* are formed between the second electrodes 146 and the electrical connectors 112*b*.

Unlike the general spacer used in a liquid crystal display (LCD), the conductive spacers 148 are used to electrically connect the two substrates as well as to maintain a cell gap between the two substrates 110 and 130, and each have a column shape having a predetermined height. In this exemplary embodiment, the conductive spacers 148 are formed by coating a conductive film on an insulator column spacer to electrically connect the two substrates 110 and 130 and also serve as spacers. Preferably, the conductive metal film coating the conductive spacer 148 is flexible and made of one selected from the group of metal materials having a low resistivity. The conductive spacer 148 may be formed during a process of forming an array device of the first substrate 110.

The above dual panel type organic EL device is a top emission type that emits light generated from the organic EL layer 144 toward the second substrate 130. Accordingly, the first electrode 140 should be selected from the group consisting of transparent conductive materials. If the first electrode 140 serves as an anode, it may be made of ITO. On the other hand, if the first electrode 140 serves as a cathode, it is preferably made of a semi-transparent metal material having a low work function. The semitransparent metal material may be selected from the group consisting of aluminum (Al), an alloy of magnesium (Mg) and Al (hereinafter referred to as 'Mg:Al'), Al:Li and Al:benzonate. In addition, since the second electrode 146 is an electrode positioned at a rear side of the light emission direction, it is preferably selected from the group consisting of opaque metal materials. Thus, when the second electrode 146 serves as an anode, the second electrode 146 is made of ITO and the opaque metal material may be further provided so as to perform as a reflective plate.

As shown in FIG. 2, there is an interval space I created between the first substrate 110 and the second substrate 130. It is preferably to forms the interval space I into an inert gas ambient. Although not shown in the drawings, the array element 112 includes a scanning line, a signal line and a power line crossed with the scanning line and separated by a predetermined distance, a switching TFT positioned at an intersection of the scanning line and the signal line, and a storage capacitor.

Unlike the related art EL device where the array element and the organic EL diode are formed on the same substrate, in the dual panel type organic EL device of the exemplary embodiment, the array element and the organic EL diode are formed on different substrates, and such an arrangement exhibits good characteristics in terms of production and management of the device because the organic EL diode does not influence the yield of the array device. Also, if a picture is implemented by the top emission way, the thin film transistor may be designed without considering the aperture ratio so that array process efficiency can be enhanced and high aperture ratio/high resolution product can be obtained. In addition, compared to the related art EL device, the dual panel structure of the exemplary embodiment can shield the organic EL diode from invasion of external air more efficiently, thereby enhancing the stability of the product.

Unlike the related art bottom emission type EL device that has the limitation in the design of the TFT, the top emission type EL device of the exemplary embodiment has the array element and the organic EL diode that are formed on different substrates, thereby obtaining the freedom in the arrangement of the TFT. Further, unlike the related art bottom emission type EL device where the first electrode is formed on the array element, the top emission type EL device of the exemplary embodiment has the first electrode of the organic EL diode formed on a transparent substrate, thereby enhancing the freedom in the design of the first electrode.

Figure 3:
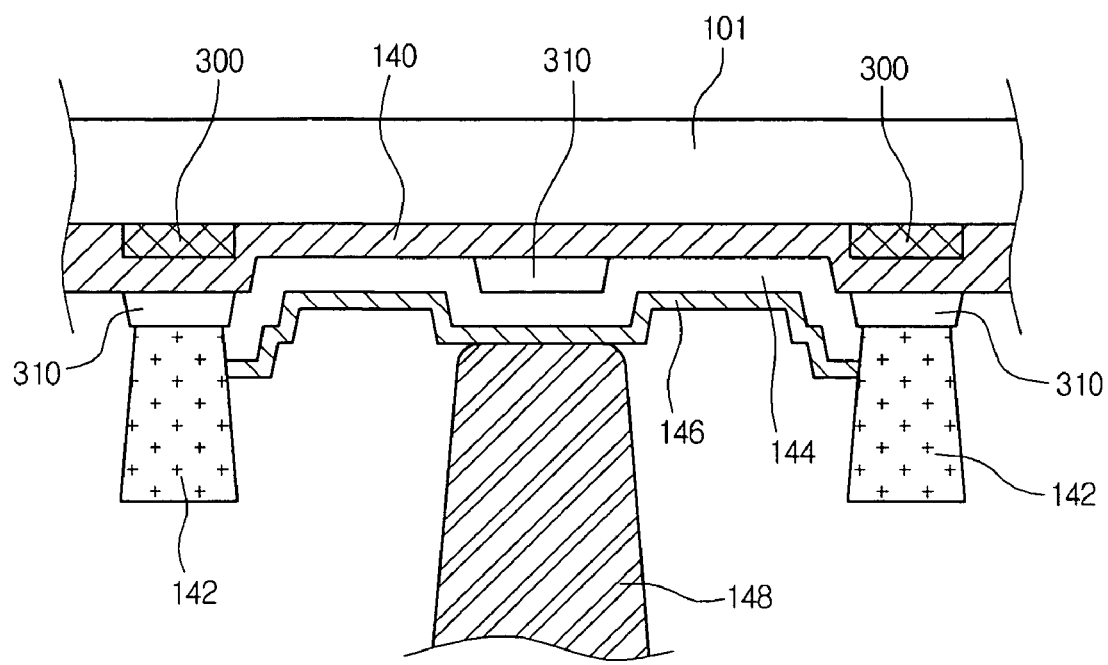
FIG. 3 is an enlarged cross-sectional view of a portion 'A' of FIG. 2.

FIG. 3 is an enlarged cross-sectional view of a portion A of FIG. 2 to show only one unit pixel region on the second substrate 130. As shown in FIG. 3, an opaque light shielding portion 300 including a plurality of light shielding patterns is formed beneath the transparent substrate 101 of the second substrate 130. The light shielding portion 300 is not formed within an inner area of the sub-pixel and is formed at an area overlapping a portion where the electrode separator 142 is formed. Also, the light shielding portion 300 serves to divide the lights generated from the respective sub-pixels so that the generated lights from the respective sub-pixels do not interfere with each other. The first electrode 140 is formed beneath the transparent substrate 101 of the second substrate 130 to cover the light shielding portion 300.

An interlayer 310 having light transmission capability is formed beneath a predetermined portion of the first electrode 140 before the organic EL layer 144 is formed. The interlayer 310 is formed at a first area overlapping the conductive spacer 148 within the sub-pixel and at a second area overlapping the electrode separator 142. Herein, the interlayer 310 may be made of either inorganic material such as silicon nitride (SiNx) or organic material. The interlayer 310 is formed within the area of the sub-pixel so as to prevent the first electrode 140 from shorting with the second electrode 146 due to a pressure from the conductive spacer 148 caused when the first and second substrates 110 and 130 are attached to each other. Thus, after the interlayer 310 is formed on the selected portions, the electrode separator 142 is formed at boundaries of the sub-pixels as described with reference to FIG. 2. Thereafter, beneath the first electrode 140 between the electrode separators 142, the organic EL layer 144 and the second electrode 146 are sequentially formed in patterns separated in each sub-pixel.

In the above-described dual panel type organic EL device, when the first substrate 110 and the second substrate 130 are attached to each other, the pressures applied by the conductive spacers 148 may be different in the sub-pixels. For this reason, the interlayers 310 have to be formed on the conductive spacers 148 with different thickness at the respective sub-pixels, but this may cause poor picture quality.

Figure 4:
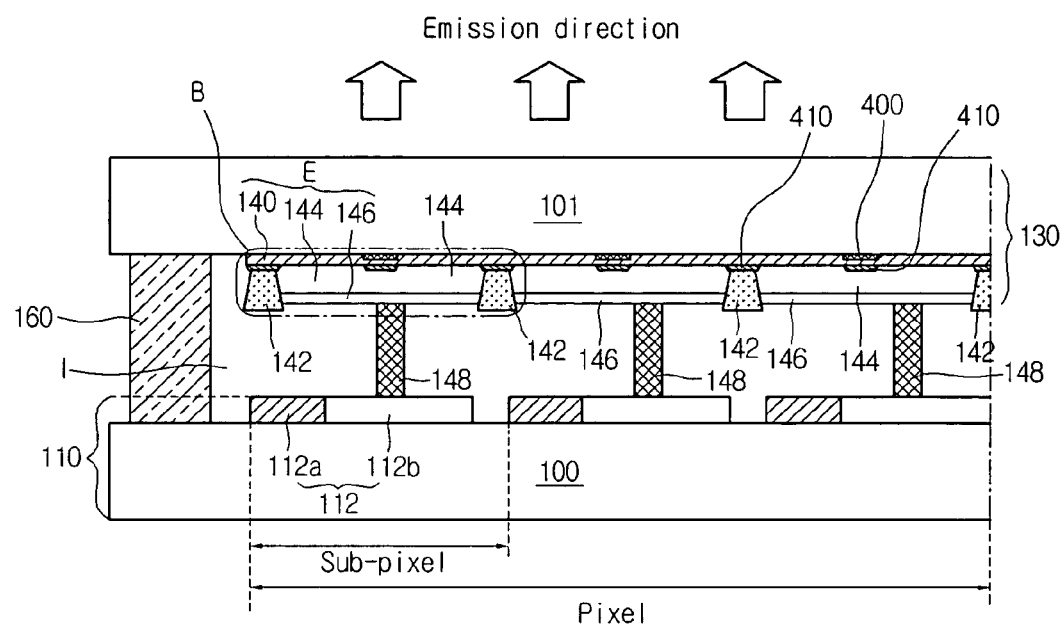
FIG. 4 is a cross-sectional view showing an organic EL device according to another exemplary embodiment of the present invention.

Next, another exemplary embodiment of the present invention will be described with reference to the accompanying drawings. FIG. 4 is a cross-sectional view showing an organic EL device including a unit pixel region according to another exemplary embodiment of the present invention. Wherever possible, the same reference numbers will be used to refer to the same or like parts and their repeated description will be omitted.

Figure 5:
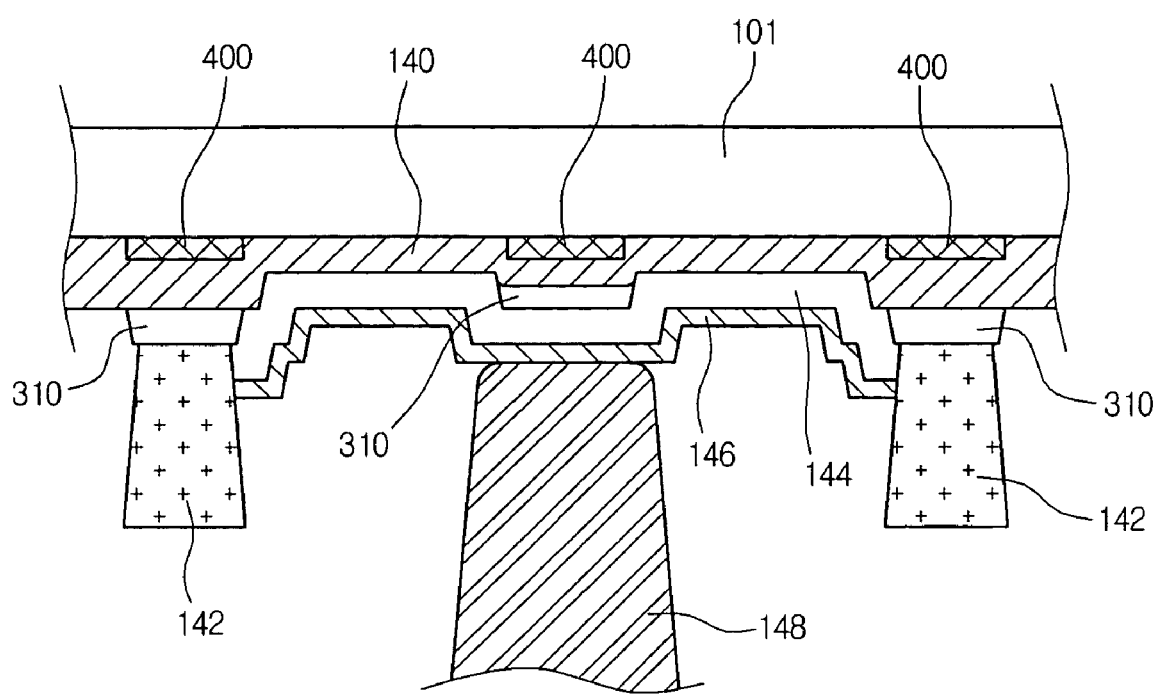
FIG. 5 is an enlarged cross-sectional view of a portion 'B' of FIG. 4.

As shown in FIG. 4, the organic EL device of this exemplary embodiment includes an opaque light shielding portion 400 formed within the area of the sub-pixel and an interlayer 410 formed of an opaque resin black matrix (BM) so as to prevent occurrence of poor picture quality. FIG. 5 is an enlarged cross-sectional view showing a portion 'B' in a unit sub-pixel area of FIG. 4. As shown in FIG. 5, the opaque light shielding portion 400 including a plurality of light shielding patterns is formed beneath the transparent substrate 101 of the second substrate 130.

In this exemplary embodiment, the light shielding portion 400 may be formed at an area overlapping a portion where the electrode separator 148 is formed, as well as an inner area of the sub-pixel. Herein, the inner area of the sub-pixel corresponds to an area overlapping the conductive spacer 148. The light shielding portion 400 formed at the inner area of the sub-pixel prevents poor picture quality when the interlayers 310 have different thickness due to the pressure applied by the conductive spacers 148. Also, in this exemplary embodiment, the light shielding portion 400 may be formed of a metal having a contact resistance smaller than the first electrode 140 made of ITO. The first electrode 140 is formed beneath the transparent substrate 101 of the second substrate to cover the light shielding portion 400.

The interlayer 310 having the light transmission capability may be formed beneath a predetermined portion of the first electrode 140 before the organic EL layer 144 is formed. The interlayer 310 may be formed at a first area overlapping the conductive spacer 148 within the area of the sub-pixel and at a second area overlapping an area where the electrode separator 142 is formed. In other words, the interlayer 310 is formed at the area between the first electrode 140 and the electrode separator 142 and at the area beneath the first electrode 140 overlapping the conductive spacer 148 within the area of the sub-pixel. Herein, the interlayer 310 may be made of either an inorganic material such as silicon nitride (SiNx) or an organic material. The interlayer 310 is formed within the area of the sub-pixel so as to prevent the first electrode from being shorted with the second electrode due to a pressure from the conductive spacer 148 caused when the first and second substrates 110 and 130 are attached to each other. Thus, after the interlayer 310 is formed on the selected portions, the electrode separator 142 is formed at boundaries of the sub-pixels as described with reference to FIG. 2. Thereafter, beneath the first electrode 140 between the electrode separators 142, the organic EL layer 144 and the second electrode 146 are sequentially formed in patterns separated in each sub-pixel.

In the dual panel type organic EL device of this exemplary embodiment, when the first substrate 110 and the second substrate 120 are attached, the pressures applied by the conductive spacers 148 may be different in the sub-pixels. For this reason, the interlayers 310 may be formed on the conductive spacers 148 to have different thickness at the respective sub-pixels to prevent the occurrence of the poor picture quality. However, the poor picture quality can be overcome by the light shielding portion 400 formed within the area of the sub-pixel. In other words, since the opaque light shielding portion 400 is formed between the selected portion of the glass substrate 101 overlapping the interlayer 310 and the first electrode 140, the poor picture quality caused due to the thickness difference of the interlayers 130 can be overcome.

Figure 6:
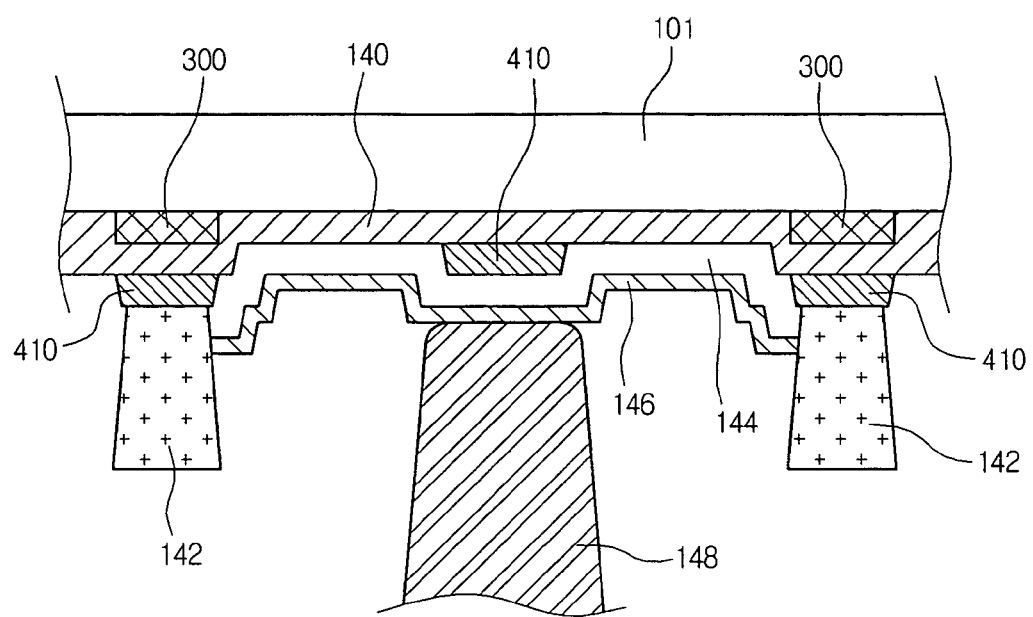
FIG. 6 is an enlarged cross-sectional view of a portion 'B' of FIG. 4 according to further another exemplary embodiment of the present invention.

FIG. 6 is an enlarged cross-sectional view of a portion B of FIG. 4 to show a unit sub-pixel area on the second substrate shown in FIG. 4 according to another exemplary embodiment. As shown in FIG. 6, an opaque light shielding portion 300 including a plurality of light shielding patterns is formed beneath the transparent substrate 101 of the second substrate 130 before the first electrode 140 is formed.

In this exemplary embodiment, the light shielding portion 300 is not formed at the inner area of the sub-pixel but is formed at an area overlapping a portion where the electrode separator 148 is formed. Alternatively, the light shielding portion 300 may be formed at the inner area of the sub-pixel as described with reference to FIG. 5. Also, the first electrode 140 is formed beneath the transparent substrate 101 of the second substrate 130 including the light shielding portion 300. Also, in this exemplary embodiment, an interlayer 410 is formed of resin black matrix (BM) having light reflection capability beneath predetermined portions of a lower surface of the first electrode 140 before the organic EL layer 144 is formed. The interlayer 410 is formed at a first area overlapping the conductive spacer 148 within the area of the sub-pixel and at a second area overlapping an area where the electrode separator 142 is formed. In other words, the interlayer 410 is formed at the area between the first electrode 140 and the electrode separator 142 and at the area beneath the first electrode 140 overlapping the conductive spacer 148 within the area of the sub-pixel.

Herein, the interlayer 410 may be made of an opaque material, for example, resin BM or the like. The interlayer 410 is formed within the area of the sub-pixel so as to prevent the first electrode from being shorted with the second electrode due to a pressure from the conductive spacer 148 caused when the first and second substrates 110 and 130 are attached to each other. Thus, after the interlayer 410 is formed on the selected portions, the electrode separator 142 is formed at boundaries of the sub-pixels as described with reference to FIG. 2. Thereafter, the organic EL layer 144 and the second electrode 146 are sequentially formed in patterns separated in the sub-pixel between the electrode separators 142.

In the dual panel type organic EL device of the exemplary embodiment, when the first substrate 110 and the second substrate 120 are attached, the pressures applied by the conductive spacers 148 may be different in the sub-pixels. For this reason, the interlayer 410 may be formed above the conductive spacers 148 to have different thickness at the respective sub-pixels, so as to prevent poor picture quality. However, in the present embodiment, since the interlayer 410 is made of opaque material, the poor picture quality can be overcome. Also, in the organic EL device of the exemplary embodiment, the opaque light shielding portion 300 may be formed within the area of the sub-pixel to overcome the poor picture quality.

It will be apparent to those skilled in the art that various modifications and variations can be made in the organic EL device of the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) device, comprising:
   a first substrate and a second substrate facing each other and spaced apart by a predetermined interval;
   an array element divided into sub-pixels on the first substrate and including thin film transistors in the sub-pixels;
   a first electrode serving as an anode and disposed directly on the second substrate;
   an electrode separator disposed below the first electrode at a boundary region between the sub-pixels;
   an organic EL layer disposed on the first electrode;
   a second electrode serving as a cathode and patterned in each of the sub-pixels by the organic EL layer and the electrode separator and the second electrode formed on the organic EL layer;
   a conductive spacer electrically connecting the thin film transistors of the first substrate with the second electrode of the second substrate and the conductive spacer maintaining a cell gap between the first and second substrates;

a plurality of interlayers respectively disposed between the first electrode and the electrode separator and between the first electrode and the organic EL layer and at regions corresponding to the electrode separator and the conductive spacer, each interlayer being formed in a pattern; and a plurality of light shielding portions respectively disposed between the first electrode and the second substrate and at regions corresponding to the electrode separator and the conductive spacer, each light shielding portion being formed in a rectangular shape, wherein the conductive spacer is disposed in an interval space between the first and second substrates; and wherein the interval space is filled with an inert gas ambient.

2. The organic EL device according to claim 1, wherein the regions include a first region between the first electrode and the electrode separator and a second region overlapping the conductive spacer in each of the sub-pixels.

3. The organic EL device according to claim 1, wherein the light shielding portion includes a metal material having a smaller resistance than the first electrode.

4. The organic EL device according to claim 3, wherein the light shielding portion includes an opaque metal.

5. The organic EL device according to claim 1, wherein the interlayer includes a light transmission material.

6. The organic EL device according to claim 5, wherein the interlayer includes any one of SiNx and an organic material.

7. An organic electroluminescence (EL) device, comprising:

a first substrate and a second substrate facing each other and spaced apart by a predetermined interval;

an array element divided into sub-pixels on the first substrate and including thin film transistors disposed in the sub-pixels;

a first electrode serving as an anode and disposed directly on the second substrate;

an electrode separator disposed below the first electrode at a boundary region between the sub-pixels;

an organic EL layer disposed on the first electrode;

a second electrode serving as a cathode and patterned in the sub-pixels by the organic EL layer and the electrode separator and the second electrode formed on the organic EL layer;

a conductive spacer electrically connecting the thin film transistors of the first substrate with the second electrode of the second substrate and the conductive spacer maintaining a cell gap between the first and second substrates;

a plurality of interlayers respectively disposed between the first electrode and the electrode separator and between the first electrode and the organic EL layer and at regions corresponding to the electrode separator and the conductive spacer, each interlayer being formed in a substantially rectangular shape; and a plurality of light shielding portions respectively disposed between the first electrode and the second substrate and at regions corresponding to the electrode separator and the conductive spacer, each light shielding portion being formed in a rectangular shape, wherein the conductive spacer is disposed in an interval space between the first and second substrates; and wherein the interval space is filled with an inert gas ambient.

8. The organic EL device according to claim 7, wherein the regions include a region between the first electrode and the electrode separator and a region overlapping the conductive spacer in each of the sub-pixels.

9. The organic EL device according to claim 7, wherein the light shielding portions include a metal material having a smaller resistance than the first electrode.

10. The organic EL device according to claim 9, wherein the light shielding portions include an opaque metal.

11. The organic EL device according to claim 7, wherein the interlayers include a light transmission material.

12. The organic EL device according to claim 11, wherein the interlayers include a opaque resin black matrix.

* * * * *